United States Patent [19]

Walker

[11] 4,075,582
[45] Feb. 21, 1978

[54] SURFACE ACOUSTIC WAVE DEVICE

[75] Inventor: Ernest L. Walker, Wappingers Falls, N.Y.

[73] Assignee: International Business Machines Corporation, Armonk, N.Y.

[21] Appl. No.: 696,095

[22] Filed: June 14, 1976

[51] Int. Cl.² .................. H03H 9/04; H03H 9/26; H03H 9/32
[52] U.S. Cl. .................................... 333/72; 310/313; 310/366; 333/30 R
[58] Field of Search ............... 333/72, 30 R; 330/5.5, 330/53–55, 174; 331/107 A; 235/181; 328/167; 310/8–8.3, 9.7–9.8, 313, 321, 322, 365, 366

[56] References Cited
U.S. PATENT DOCUMENTS 3,836,876  9/1974  Marshall et al. ................. 333/72 X
3,987,376  10/1976  Kerbel ............................ 333/72 X Primary Examiner—Alfred E. Smith
Assistant Examiner—Marvin Nussbaum
Attorney, Agent, or Firm—Harold H. Sweeney, Jr.

[57] ABSTRACT

A surface acoustic wave filter is provided having an input and an output transducer, each consisting of a pair of comb-like structures, wherein the electrodes or teeth are interleaved and are varied in length in accordance with a weighting function determined by the Fourier transformation of the respective transducer characteristic frequency response so as to each produce a pair of frequency passbands symmetrical about their characteristic frequency. The latter frequency passband of the input transducer has the same passband center frequency as the first frequency passband of the output transducer. The coincident passbands of said input and output transducers resulting in an output from the output transducer having the center frequency of the coincident passbands.

9 Claims, 2 Drawing Figures

SURFACE ACOUSTIC WAVE DEVICE

STATEMENT OF THE INVENTION

The invention relates to surface acoustic wave filtering devices and, more particularly, to surface acoustic wave devices for producing a desired frequency response which is intermediate the characteristic frequency responses of the input and output transducers.

BACKGROUND OF THE INVENTION

Surface acoustic wave filters consist generally of an input and output transducer located on a piezo-electric material substrate. The transducers each consist of a pair of comb-like structures in which the teeth of a pair are interleaved. The size and spacing of the teeth of the comb-like structure and the number thereof determine the frequency response passband of the particular transducer. The teeth or electrodes of the comb-like structures forming the transducer are formed on the substrate material using a photolithographic process. For example, the substrate is coated with a conductive material and, by means of a photographic process, a mask is generated which is placed over the material coated on the substrate such that the exposed coating can be etched away leaving the comb-like structure of the mask. The artwork generator for making the masks has certain limitations in that the artwork can only be generated in certain size steps, each of which produce a different frequency passband.

In the prior art the center frequency of the passband or the characteristic frequency response of the transducer can be determined by determining the width and the spacing involved in the transducers during the manufacturing process. Characteristic frequencies intermediate the artwork generator resolution cannot be obtained.

It is a general object of the present invention to provide an improved surface acoustic wave device in which the frequency passband can be adjusted to have a center frequency which lies between the characteristic frequencies of the input and output transducers.

It is another object of the present invention to provide an improved surface acoustic wave device having a frequency response passband about a center frequency which is beyond the resolution of the artwork generator used in manufacturing the input and output transducers.

SUMMARY OF THE INVENTION

The invention provides a surface acoustic wave filter device consisting of an input and output transducer located on a piezoelectric material substrate. Each of the transducers consist of a first and second comb-shaped element in which the teeth or electrodes are interleaved and are of a given respective width and spacing, such that energization of the input transducer will produce an acoustic surface wave in the substrate having a particular frequency characteristic which is determined by the interleaved electrodes of the input transducer. Similarly, the output transducer has a predetermined number of teeth or electrodes interleaved with one another, which are of a given respective width and spacing, to give a different frequency passband about a different center frequency. The overlap in length of the electrodes in each of the input and output transducers are determined in accordance with a weighting function determined by the Fourier transformation of the ideal frequency response of the respective transducers, thereby producing a pair of frequency passbands for each of the transducers which is symmetrical about their respective characteristic frequencies. A coupling means is located on the substrate between the input and output transducers for receiving, transforming and retransmitting the pair of frequency responses from the input transducer to said output transducer. The pair of frequency responses from the input transducer are selected to have the latter frequency response thereof at the same intermediate frequency as the first frequency response of the output pair of frequency responses from the output transducer. The coincident frequency responses of said input and output transducers resulting in an output from the output transducer having the center frequency of the coincident frequency responses.

The foregoing and other objects, features and advantages of the invention will be apparent from the following more particular decription of a preferred embodiment of the invention as illustrated in the accompanying drawings.

DETAILED DESCRIPTION OF THE INVENTION

Figure 1:
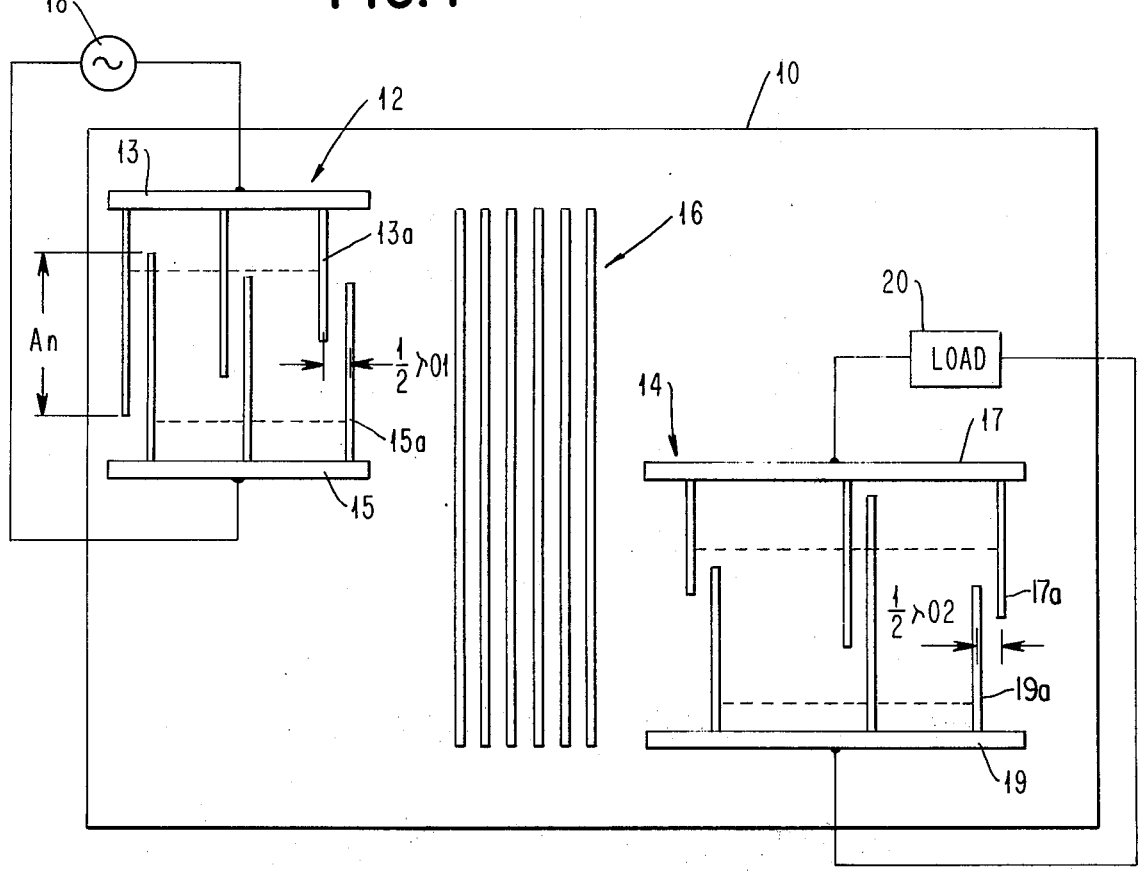
FIG. 1 is a schematic diagram of a surface acoustic wave device in which the transducer electrode lengths are arranged to have an overlap determined by a weighting function in accordance with the present invention.

Referring to FIG. 1, there is shown a substrate 10 made of a material having a piezoelectric characteristic such as quartz or lithium niobate ($LiNbO_3$). The substrate 10 contains an input transducer 12 and an output transducer 14 separated by a coupler 16 providing a beam transformation between the input and output transducers. The transducers 12, 14 are each constructed of two comb-like arrays 13, 15 and 17, 19 respectively each having electrodes or teeth 13a, 15a and 17a, 19a, respectively. The distance between the centers of two consecutive electrodes or teeth in each array is ½ of the acoustic wavelength $\lambda_{01}$ and $\lambda_{02}$, respectively, corresponding to the two characteristic frequencies $f_{01}$ and $f_{02}$.

The description of the basic operation of a surface acoustic wave device will facilitate an understanding of the invention. The direct piezoelectric surface wave transduction is accomplished by the spacially periodic inter-digital electrodes 13a, 15a of transducer 12. When a signal from source 18 having a frequency within the passband of the transducer is received, a periodic electric field is produced by the electrodes and through piezoelectric coupling this electrical signal is transduced to a travelling acoustic surface wave on the substrate 10. This occurs when the strain components produced by the electric fields in the piezoelectric substrate are substantially matched to the strain components associated with the surface wave mode. The acoustic surface wave is received by the coupler 16, which essentially transforms the acoustic signal into an electrical signal having the desired width for transmission to the output transducer 14. In reality, the coupler 16 is used, for the present invention, to transform different width signals into predetermined same width signals for use by the output transducer 14. The coupler 16 electrical signal is transduced into a further acoustic wave signal travelling away from the coupler towards the output transducer 14. At the output transducer 14, the surface wave is converted to an electrical output signal for application to load 20.

The transducers 12 and 14 as well as the coupler 16 are formed on the substrate by means of a photolithographic process. The substrate is coated with a conductive material, such as aluminum, and a mask generated by the artwork generator is made, which when placed over the coated substrate and the exposed parts are etched away leaves an image, which corresponds to the mask. The artwork generator is only capable of producing masks and consequently transducers having a predetermined fixed step of spacings and widths. As was previously mentioned, the width and spacing of the teeth in the comb structures of the transducers determines the frequency response obtained by the transducer. Assuming the artwork generator has some specific resolution limitation, the present invention will allow a transducer or filter to be made which provides a frequency response in between the artwork generating resolution. To obtain the desired frequency response from the filter intermediate the artwork generation resolution, the input transducer 12 is designed to have a dual passband frequency response which is symmetrical about the next lowest frequency that can be resolved by the artwork generator. This is best demonstrated in FIG. 2 where the frequency response $|H_1(f)|$ of the input transducer 12 is shown. The center frequency of the transducer which is the next lowest frequency which can be produced by the artwork generator is $f_{01}$. It should be noted that the response of the input transducer is symmetrical about this frequency. Similarly, the response characteristics $|H_2(f)|$ of the output transducer are shown as being symmetrical about the frequency $f_{02}$, which is the next highest frequency after the selected intermediate frequency ($f_0$) capable of being generated by the artwork generator. The resultant frequency response characteristic $|H_0(f)|$ is shown as having the center frequency $f_0$ which is the selected frequency and which corresponds to the center frequency of the passband characteristic of the last response of $|H_1(f)|$ and the first response of $|H_2(f)|$. The values for $\Delta f_1$ and $\Delta f_2$ are determined from the difference between the selected intermediate frequency and the design frequencies of the input and output transducers. Any center frequency between $f_{01}$ and $f_{02}$ can be realized as long as $\Delta f_1$ and $\Delta f_2$ are greater than $\Delta f_b/2$. When this limit is reached different values of $f_{01}$ and $f_{02}$ should be chosen. Actually, this technique removes the limitation of discreteness in the frequency domain since $\Delta f_1$, $\Delta f_2$, $f_{01}$ and $f_{02}$ can be chosen to best accommodate the desired $f_0$ and $\Delta f_b$. The practical limits for the approximate relationship between these parameters are summarized in the equations as follows:

$$\frac{3\Delta f_b}{f_{01}} \leq BW_e \leq \frac{2\Delta f_1}{f_{01}} \leq .5$$

and $$\frac{3\Delta f_b}{f_{02}} \leq BW_e \leq \frac{2\Delta f_2}{f_{02}} \leq .5$$

Where $BW_e$ = Effective Bandwidth.

Passband response $|H_0(f)|$ with a center frequency of $f_0$ is the resultant of the cascading of $H_1(f)$ and $H_2(f)$ via the coupler 16 or, in logical terms, $H_1(f)$ and $H_2(f)$. The relationship that controls $f_0$ is $f_0 = f_{01} + \Delta f_1 = f_{02} - \Delta f_2$.

Figure 2:
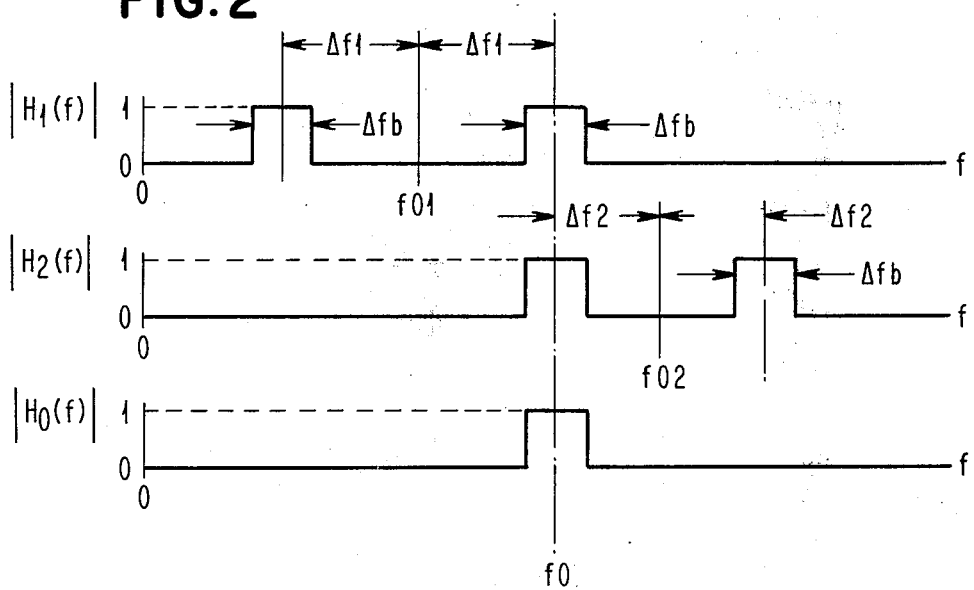
FIG. 2 is a schematic diagram showing passbands and frequency relationships of the transducers in the surface acoustic wave device of FIG. 1.

In order to achieve the intermediate frequency passband $|H_0(f)|$ of FIG. 2, the two transducers must be weighted correctly to obtain the dual passbands. The weighting function is accomplished by altering the length of the comb electrodes with respect to other electrodes in the transducer. In other words, the overlap of the adjacent electrodes in the transducers are so controlled as to provide the desired dual passband response from the transducer. The weighting function is determined by the Fourier transformation of the ideal frequency response of the transducer. Referring again to FIG. 2, $|H_1(f)|$ is defined by the following equation:

$$|H_1(f)| = U(f - f_{01} + \Delta f_1 + \frac{\Delta f_b}{2}) - U(f - f_{01} + \Delta f_1 - \frac{\Delta f_b}{2}) + U(f - f_{01} - \Delta f_1 + \frac{\Delta f_b}{2}) - U(f - f_{01} - \Delta f_1 - \frac{\Delta f_b}{2})$$

Where $U(f)$ is the unit step in the frequency domain.

Writing the equation of $|H_1(f)|$ in terms of it's Fourier series expansion we obtain:

$$H_1(f) = \frac{A_0}{2} + A_1 \cos\frac{\pi f}{f_{01}} + A_2 \cos\frac{2\pi f}{f_{01}} \ldots$$

where $$A_n = \frac{1}{f_{01}} \int_0^{2f_{01}} H_1(f) \cos\frac{n\pi f}{f_{01}} df =$$

$$\left(\frac{2\Delta f_b}{f_{01}}\right),$$

$$\left(\frac{4}{\pi} \frac{(-1)^n}{n} \sin\frac{n\pi \Delta f_b}{2f_{01}} \cos\frac{n\pi \Delta f_1}{f_{01}}\right) n = 1,2,3-N$$

N (the number of overlaps needed) is chosen to satisfy the ripple characteristics of the filter. The actual weighting function $Wn_1$ is given by $Wn_1 = A_N, A_{N-1}, \ldots A_0 \ldots A_{N-1}, A_N$.

The weighting function for $|H_2(f)|$ is derived the same way and in the same form as $Wn_1$ with the exception that $f_{02}$ and $\Delta f_2$ replaces $f_{01}$ and $\Delta f_1$ in the equations.

Referring again to FIG. 1, it can be seen that the overlap between the adjacent teeth is a function of the lengths of the teeth. These lengths are determinative of the weighting function which is obtained from the above equations.

As an example, it was desired to provide a passband output from a surface acoustic wave filter having a center frequency of 44 mhz. The artwork generator resolution was 25 micro inches. Accordingly, $f_{01}$ was selected to be 33.641 mhz. and $f_{02}$ was selected to be 67.283 mhz. The input transducer was designed to have 47 finger pairs with a wavelength equal to 4 mils. It was found that a finger spacing of 1 mil and a finger width of 1 mil would produce a transducer having the requisite 33.641 megacycles center frequency. A multi-strip coupler having 165 strips and 164 spaces was located between the input and output transducers. The output transducer was designed to have a center frequency $f_{02} = 67.283$ megacycles. This required 93 finger pairs and a wavelength of 2 mils. The multi-strip coupler was equally spaced from the input and output filter at 21.25 mils. The gap width in the output filter was 0.5 mils and the finger width was 0.5 mils. It can be seen that the increase in characteristic frequency response requires a greater number of electrodes or fingers and a closer spacing of the fingers as well as a narrower finger width. Having the above information and selecting the desired passband center frequency of 44 megacycles the $\Delta f_1$ can be easily calculated. For example, the designed center frequency for the input transducer of 33.641 mhz. when subtracted from 44 mhz. gives $\Delta f_1$ as 10.359 mhz. $\Delta f_b = 4.205$ mhz.

Substituting these frequencies into the above expression for $An$, the overlaps between the finger pairs are obtained. The weighting function for a transducer having a center frequency $f_{01}$ of 33.641 and using the given dimensions results in normalized tap weights of $A_0 = 1$ $$
\begin{aligned}
A_1 &= -.5638 \\
A_2 &= -.3469 \\
A_3 &= .9163 \\
A_4 &= -.6721 \\
&\vdots \\
A_n &=
\end{aligned}
$$

Similarly, the weighting function for the output transducer 14 is derived the same way except that the center frequency $f_{02} = 67.283$ in the example and $\Delta f_2 = 23.283$ mhz. replaces $f_{01}$ and $\Delta f_1$, respectively, in the expression for $An$. The resulting normalized tap weights for the output transducer are as follows:

$$
\begin{aligned}
A_0 &= 1 \\
A_1 &= -.8839 \\
A_2 &= .5638 \\
A_3 &= -.1177 \\
A_4 &= -.3469 \\
&\vdots \\
A_n &=
\end{aligned}
$$

It should be appreciated that a desired passband having a center frequency which lies between the resolution capabilities of the artwork generation means for manufacturing the input and output transducers, can be obtained by determining the overlap between adjacent fingers or electrodes in the comb structures making up the transducers. These overlaps are obtained in accordance with a weighting function determined by the Fourier transformation of the respective characteristic frequency responses of the input and output filters so as to each produce a pair of responses symmetrical about their respective characteristic frequencies. Actually, the steps include designing an input transducer having a characteristic frequency $f_{01}$ which is the next lowest frequency below the selected frequency producible by the artwork generation means. Determining $\Delta f_1$, the difference between the design frequency and the desired center frequency response. Placing these frequencies into the Fourier series transformation for the particular transducer, results in the overlaps for each of the finger pairs, and, accordingly, the weighting function for the transducer. Similarly, the output transducer is designed about it's characteristic center frequency $f_{02}$ and $\Delta f_2$ is determined, and these frequencies are utilized in the formula for obtaining the overlaps of the finger pairs. Accordingly, the weighting function $Wn_2$ is determined. The combination of the weighting functions designed into the input and output transducers results in a frequency response of the filter which has the desired center frequency intermediate the design frequencies of the input and output transducers.

The invention not only provides an output passband around a center frequency which is outside the artwork generator capabilities, but provides good multiple transit reflection suppression. Actually, the highest reflection level occurs at the characteristic frequency of the transducer. Since the frequency passband responses obtained from the input and output transducers are remote from their characteristic frequencies, the reflection level is substantially reduced. Also, the input and output transducers have different characteristic frequencies which further tends to suppress multiple transit reflections.

While the invention has been particularly shown and described with reference to a preferred embodiment thereof, it will be understood by those skilled in the art that the various changes in form and detail may be made therein without departing from the spirit and scope of the invention.

What is claimed is:

1. A surface acoustic wave filter device comprising:
   a piezoelectric substrate capable of propagating surface acoustic waves therein;
   an input and an output transducer located on said substrate, each having first and second comb shaped elements in which the teeth or electrodes are interleaved and are of a given respective width and spacing to provide respective different characteristic frequency responses from said transducers;
   means for determining the lengths of the electrodes thereby determining the amount of overlap of interleaved electrodes in each of the input and output transducers in accordance with a weighting function determined by the Fourier transformation of the characteristic frequency response to said input and output transducers to produce a pair of frequency passbands for each of said transducers symmetrical about their respective center characteristic frequencies and having a passband of each of said pair of frequency passbands overlapping;
   means for energizing said input transducers so as to produce a pair of responses at the frequencies of said input transducer frequency passbands respectively;
   coupling means located on said substrate between said input and output transducers for receiving, transforming and retransmitting said pair of responses from said input transducer to said output transducer;
   the cascading of the pairs of responses in said output transducer producing a response at the frequencies of the overlapping passbands from said output transducer.

2. A surface acoustic wave filter device according to claim 1, wherein the characteristic frequency response of said input transducer is at a lower frequency than the characteristic frequency response of said output transducer and the overlapping frequency passbands are the higher frequency passband of the input transducer and the lower frequency passband of the output transducer.

3. A surface acoustic wave filter device according to claim 1, wherein said input and output transducers having different characteristic frequencies each have their pairs of frequency responses sufficiently remote from the respective different characteristic frequencies of the respective input and output transducers to give good multiple transit reflection suppression.

4. A surface acoustic wave filter device according to claim 1, wherein the weighting function is determined by the Fourier transformation of the ideal frequency response of the input transducer represented by the equation:

$$H_1(f) = U(f - f_{01} + \Delta f_1 + \frac{\Delta f_b}{2}) -$$
$$U(f - f_{01} + f_1 - \frac{\Delta f_b}{2}) +$$
$$U(f - f_{01} - \Delta f_1 + \frac{\Delta f_b}{2}) -$$
$$U(f - f_{01} - f_1 - \frac{\Delta f_b}{2})$$

where $U(f)$ is the unit step in the frequency domain,
where $H_1(f)$ is the ideal frequency response of the input transducer,
$f_{01}$ is the characteristic frequency of the input transducer,
$\Delta f_1$ is the difference between the center frequency of the response and the characteristic frequency of the input frequency,
$\Delta f_b$ is the frequency passband.

5. A surface acoustic wave filter according to claim 4, wherein the overlaps between electrode pairs of the input transducer is determined by the Fourier series expansion of the ideal frequency response of the input transducer as follows:

$$H_1(f) = \frac{A_0}{2} + A_1 \cos\frac{\pi f}{f_{01}} + A_2 \cos\frac{2\pi f}{f_{01}} \ldots$$

where $$An = \frac{1}{f_{01}} \int_0^{2f_{01}} H_1(f) \cos\frac{n\pi f}{f_{01}} df =$$

$$\left(\frac{2\Delta f_b}{f_{01}}\right),$$

$$\left(\frac{4}{\pi} \frac{(-1)^n}{n} \sin\frac{n\pi\Delta f_b}{2f_{01}} \cos\frac{n\pi\Delta f_1}{f_{01}}\right) n = 1,2,3\text{--}N$$

where N = the number of overlap pairs + 1
and $An$ = the overlaps between electrode pairs.

6. A surface wave acoustic filter device according to claim 5, wherein the weighting function applied to the input transducer ($Wn_1$) is given by $$Wn_1 = A_N A_{N-1} \ldots A_0 \ldots A_{N-1} A_N.$$

7. A surface acoustic wave filter device according to claim 1, wherein the weighting function is determined by the Fourier transformation of the ideal frequency response of the output transducer ($H_2(f)$) represented by the equation:

$$H_2(f) = U(f - f_{02} + \Delta f_2 + \frac{\Delta f_b}{2}) -$$
$$U(f - f_{02} + \Delta f_2 - \frac{\Delta f_b}{2}) +$$
$$U(f - f_{02} - \Delta f_2 + \frac{\Delta f_b}{2}) -$$
$$U(f - f_{02} - \Delta f_2 - \frac{\Delta f_b}{2})$$

where $U(f)$ is the unit step in the frequency domain, $f_{02}$ is the characteristic frequency of the output transducer,
$\Delta f_2$ is the difference between the center frequency of the response and the center frequency of the output transducer,
and $\Delta f_b$ is the selected frequency passband.

8. A surface acoustic wave filter according to claim 7, wherein the overlaps between electrode pairs of the output transducer is determined by the Fourier series expansion of the ideal frequency response of the output transducer as follows:

$$H_2(f) = \frac{A_0}{2} + A_1 \cos\frac{\pi f}{f_{02}} + A_2 \cos\frac{2\pi f}{f_{02}} \ldots$$

where $$An = \frac{1}{f_{02}} \int_0^{2f_{02}} H_2(f) \cos\frac{2\pi f}{f_{02}} df =$$

$$\left(\frac{2\Delta f_b}{f_{02}}\right),$$

$$\left(\frac{4}{\pi} \frac{(-1)^n}{n} \sin\frac{n\pi\Delta f_b}{2f_{02}} \cos\frac{n\pi\Delta f_b}{f_{02}}\right) n = 1,2,3\text{--}N$$

where N = number of overlap pairs + 1
and $An$ = the overlaps between electrode pairs.

9. A surface acoustic wave filter device according to claim 8, wherein the weighting function applied to the output transducer ($Wn_2$) is given by $$Wn_2 = A_N A_{n-1} \ldots A_0 \ldots A_{N-1} A_N.$$

* * * * *